(12) United States Patent
Im et al.

(10) Patent No.: US 11,653,554 B2
(45) Date of Patent: May 16, 2023

(54) MASK, METHOD OF MANUFACTURING THE SAME, AND METHOD OF MANUFACTURING DISPLAY PANEL

(71) Applicant: Samsung Display Co., Ltd., Yongin-Si (KR)

(72) Inventors: Sungsoon Im, Suwon-si (KR); Youngmin Moon, Yongin-si (KR); Ji-Hee Son, Hwaseong-si (KR); Minho Moon, Seongnam-si (KR); Seungyong Song, Suwon-si (KR); DuckJung Lee, Hwaseong-si (KR); Seul Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 17/014,841

(22) Filed: Sep. 8, 2020

(65) Prior Publication Data

US 2021/0217956 A1 Jul. 15, 2021

(30) Foreign Application Priority Data

Jan. 13, 2020 (KR) .......................... 10-2020-0004067

(51) Int. Cl.
*H01L 51/56* (2006.01)
*H01L 51/00* (2006.01)
*C23C 14/04* (2006.01)

(52) U.S. Cl.
CPC ........ *H01L 51/0011* (2013.01); *C23C 14/042* (2013.01); *H01L 51/56* (2013.01)

(58) Field of Classification Search
CPC ........ B29K 2995/0008; H01L 51/0011; H01L 51/56; C23C 14/042
See application file for complete search history.

(56) References Cited

U.S. PATENT DOCUMENTS

| 6,897,164 | B2 | 5/2005 | Baude et al. |
| 2003/0150384 | A1* | 8/2003 | Baude ................ H01L 51/0011 118/721 |
| 2016/0221017 | A1* | 8/2016 | Huang .................... B29C 43/52 |
| 2016/0236220 | A1* | 8/2016 | Kim ........................ B29C 41/02 |
| 2019/0106781 | A1 | 4/2019 | Sakio et al. |

FOREIGN PATENT DOCUMENTS

| JP | 4490105 B2 | 6/2010 |
| JP | 6142388 B2 | 6/2017 |
| JP | 6345901 B2 | 6/2018 |

* cited by examiner

*Primary Examiner* — Jaehwan Oh
(74) *Attorney, Agent, or Firm* — Innovation Counsel LLP

(57) ABSTRACT

Provided is a mask which includes a mask body having a plurality of through hole portions and including a polymer film and a plurality of magnetic particles dispersed in the polymer film, and a polymer coating layer disposed on an outer surface of the mask body. Accordingly, the time and cost of manufacturing a mask are reduced and the precision of a deposition process is improved as well, so that the manufacturing yield of a display panel using the mask is improved and a display panel manufactured using the same has improved reliability.

20 Claims, 13 Drawing Sheets

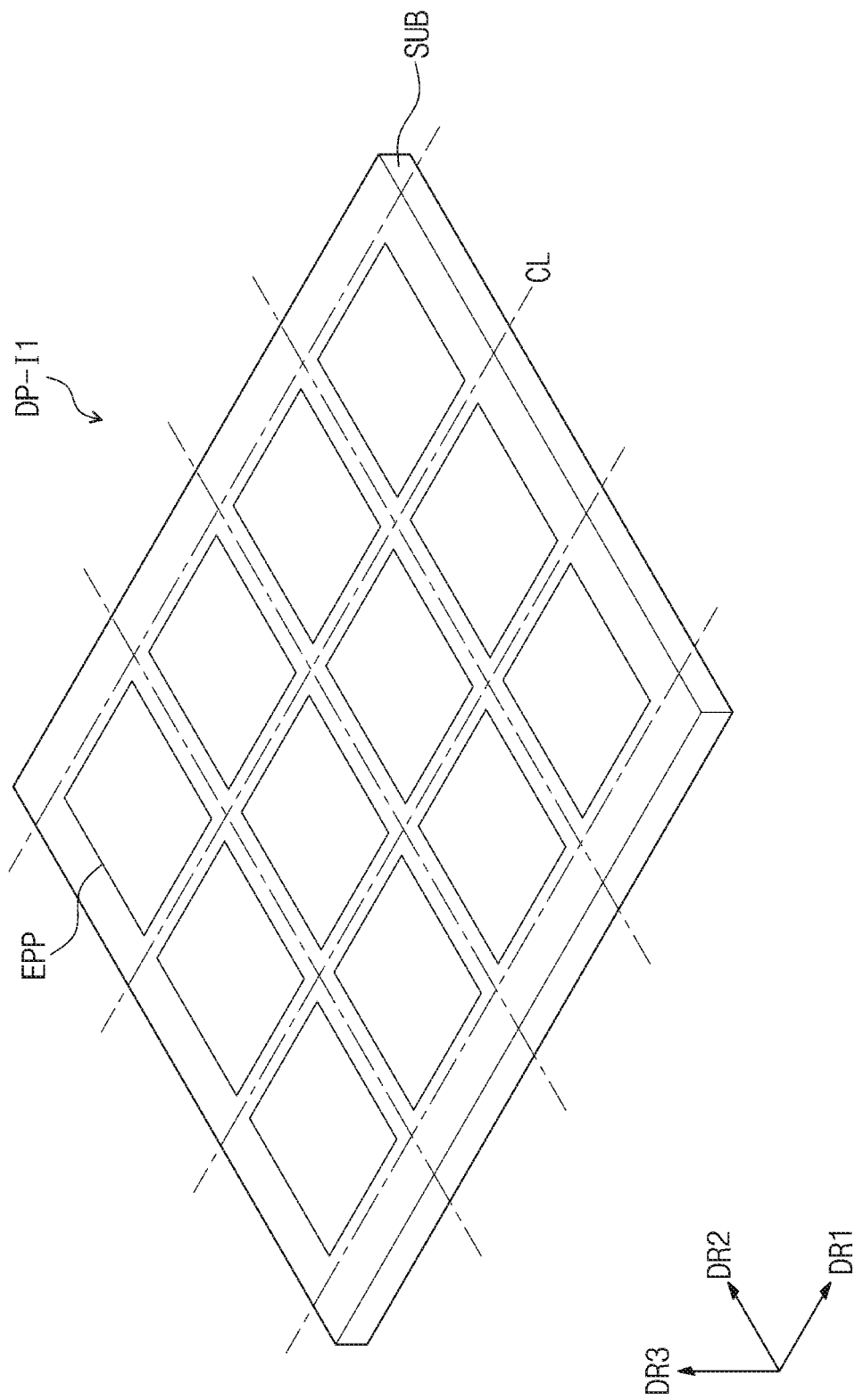

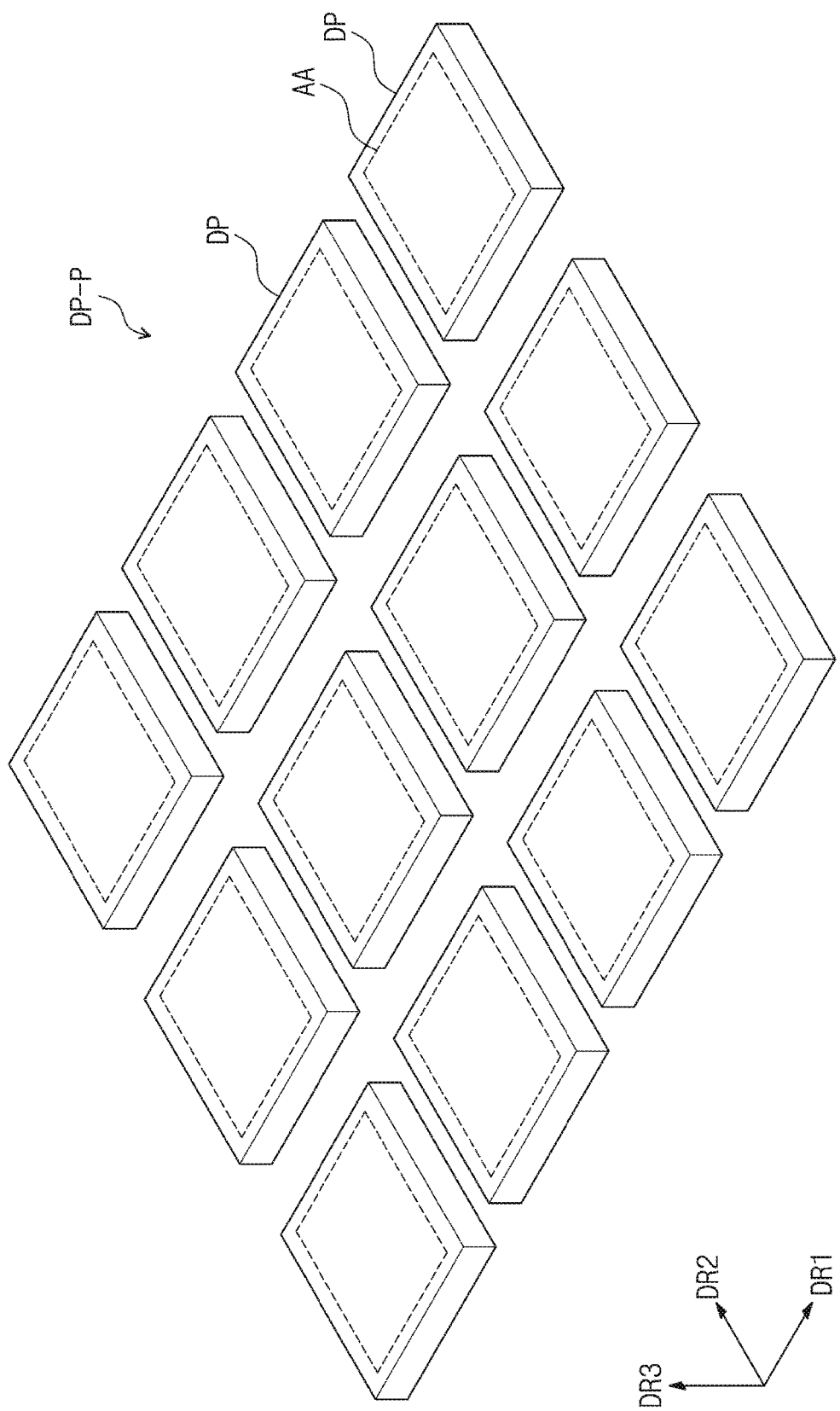

MASK, METHOD OF MANUFACTURING THE SAME, AND METHOD OF MANUFACTURING DISPLAY PANEL

CROSS-REFERENCE TO RELATED APPLICATIONS

This U.S. non-provisional patent application claims priority under 35 U.S.C. § 119 of Korean Patent Application No. 10-2020-0004067, filed on Jan. 13, 2020, the entire contents of which are hereby incorporated by reference.

BACKGROUND

1. Technical Field

Generally, the present disclosure relates to a mask, a method of manufacturing the same, and a method of manufacturing a display panel, and more particularly, to a mask having improved process yield and reliability, a method of manufacturing the same, and a method of manufacturing a display panel.

2. Related Art

A display panel includes a plurality of pixels. Each of the pixels includes a driving element such as a transistor and a display element such as an organic light emitting diode. The display element may be formed by stacking an electrode and a light emitting pattern on a substrate.

The light emitting pattern is formed through patterning using a mask having a through portion defined therein such that the light emitting pattern is formed in a predetermined region. The light emitting pattern may be formed in a region exposed by the through portion. The shape of the light emitting pattern may be controlled according to the shape of the through portion.

However, due to complexity of fabricating the display panel, the cost and time for manufacturing masks increases, and defect rate during the fabrication process of the display panel increases as well. Thus, there is need to develop a novel way to reduce the cost and time for manufacturing masks, and reduce defect rate during the fabrication process so that the manufacturing yield of a display panel using the masks is improved.

SUMMARY

The present disclosure provides a mask having improved reliability of a deposition process and a method of manufacturing a display panel using the same.

The present disclosure also provides a mask and a method of manufacturing the same, capable of preventing defects such as shadows in a deposition process using the mask while reducing the time and cost of manufacturing a mask.

An embodiment of the present disclosure provides a mask including a mask body having a plurality of through hole portions, and having a polymer film and a plurality of magnetic particles dispersed in the polymer film, and a polymer coating layer disposed on an outer surface of the mask body.

Each of the polymer film and the polymer coating layer may includes polyimide (PI) respectively.

Each of the magnetic particles is at least one metal selected from the group consisting of iron (Fe), manganese (Mn), nickel (Ni), and cobalt (Co), or an alloy containing at least one selected from the group.

The polymer coating layer may contact the polymer film.

The polymer film and the polymer coating layer may be made out of the same material.

The polymer film may have a thickness of about 3 μm to about 50 μm.

The magnetic particle may have a diameter of about 3 nm to about less than 10 μm.

The polymer coating layer may have a thickness of about 1 μm to about 10 μm.

The polymer coating layer may cover an entireties of an upper surface and a lower surface of the polymer film, and cover inner walls of the plurality of through hole portions.

In an embodiment of the present disclosure, a method of manufacturing a mask includes steps of forming a mask body through a polymer resin in which a plurality of magnetic particle are dispersed, patterning a plurality of through hole portions in the mask body, and forming a polymer coating layer by coating and covering inner walls of the plurality of through hole portions with a polymer resin.

During the forming of the mask body, the polymer resin may include polyimide (PI), and the magnetic particles may include at least one metal selected from the group consisting of iron (Fe), manganese (Mn), nickel (Ni), and cobalt (Co), or an alloy containing at least one selected from the group.

The forming of the mask body may include coating a carrier substrate with the polymer resin in which the magnetic particles are dispersed.

The forming of the mask body may be accomplished by steps of performing a primary coating with the polymer resin, dispersing the magnetic particles in the polymer resin subjected to the primary coating, and performing a secondary coating with the polymer resin on the polymer resin subjected to the primary coating.

The plurality of through hole portions may be patterned using a laser.

The polymer coating layer may cover an entireties of an upper surface and a lower surface of the mask body.

The mask body and the polymer coating layer may be formed through the same polymer resin.

In an embodiment of the present disclosure, a method of manufacturing a display panel includes preparing a target substrate, disposing, below the target substrate, a mask in which a plurality of through hole portions are defined, forming, below the target substrate, a plurality of light emitting patterns corresponding to the plurality of through portions, and removing the mask, wherein the mask includes a mask body having the plurality of through hole portions, and having a polymer film and a plurality of magnetic particles dispersed in the polymer film, and a polymer coating layer disposed on an outer surface of the mask body.

During the disposing of the mask below the target substrate, each of the magnetic materials spaced apart from the mask with respect to the target substrate which is disposed in-between may be disposed.

During the disposing of the mask below the target substrate, the target substrate and the mask may contact each other.

The display panel may include a plurality of pixels, and each of the plurality of light emitting patterns may be arranged in the pixels respectively.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 8A, 8B, and 8C are perspective views briefly illustrating some steps of a method of manufacturing a display panel according to an embodiment of the present disclosure;

DETAILED DESCRIPTION

Figure 1:
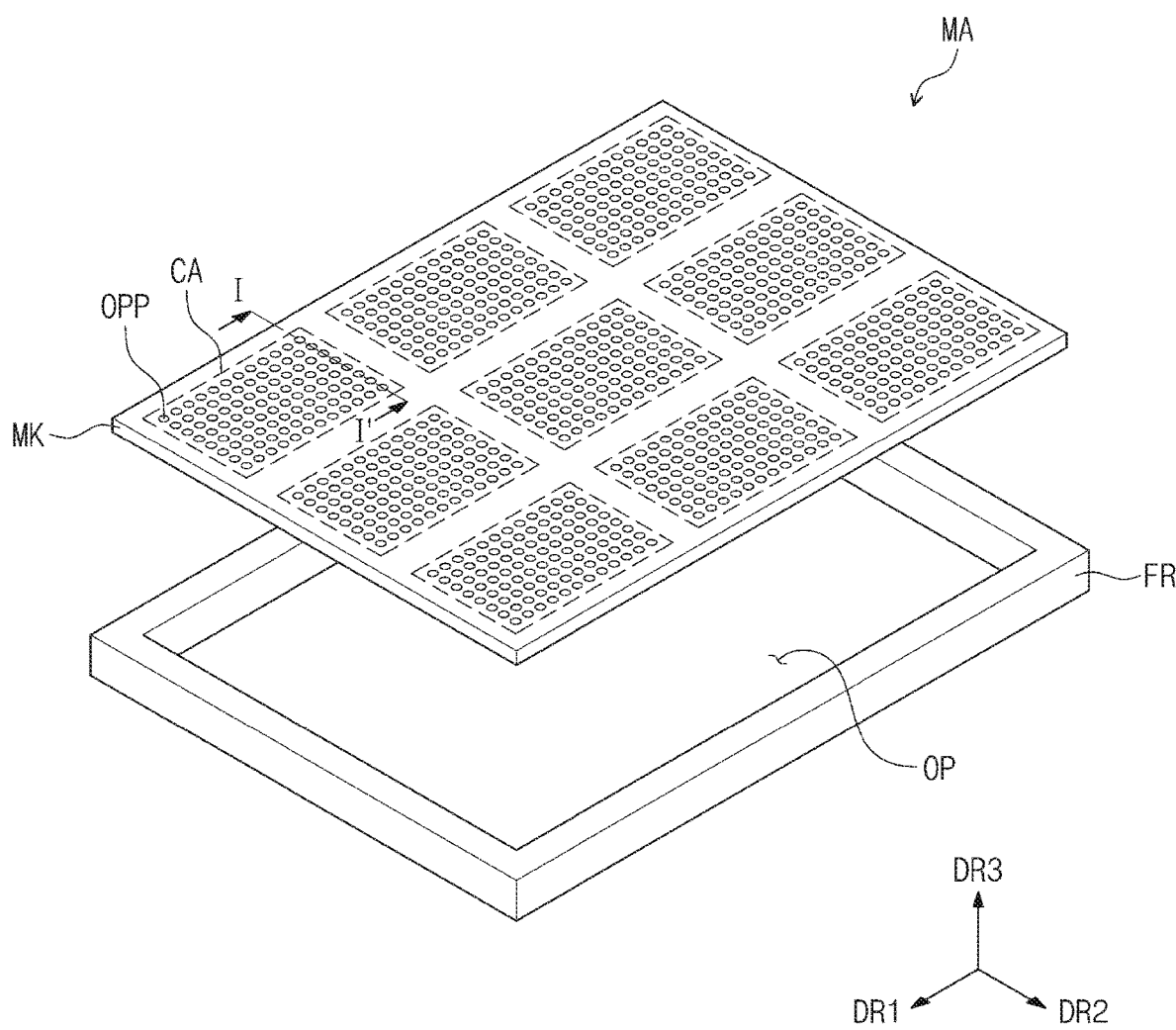
FIG. 1 is an exploded perspective view of a mask assembly according to an embodiment of the present disclosure.

Hereinafter, embodiments of the present disclosure will be described with reference to the accompanying drawings. In the present disclosure, when an element (or a region, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a mask according to an embodiment of the present disclosure will be described with reference to the accompanying drawings.

FIG. 1 is an exploded perspective view of a mask assembly according to an embodiment of the present disclosure.

Referring to FIG. 1, a mask assembly MA may be used in a process of depositing a deposition material. In an embodiment of the present disclosure, the mask assembly MA may include a frame FR and a mask MK.

An upper surface of each component is parallel to a surface defined by a first direction DR1 and a second direction DR2. The thickness direction of each component is indicated by a third direction DR3. An upper side (or upper part) and a lower side (or lower part) of each component are defined along the third direction DR3. However, directions indicated by the first to third directions DR1, DR2, and DR3 may be relative concepts and may be changed into other directions.

The frame FR may have a ring shape on a plane. That is, an opening OP may be provided in a region including the center of the frame FR. The opening OP may be a hollow hole defined from a top surface of the frame FR to a bottom surface of the frame FR.

In FIG. 1, a rectangular ring shape is illustrated as an example of the shape of the frame FR, but the shape of the frame FR is not limited. For example, the frame FR may have various other shapes such as a circular ring and a polygonal ring. FIG. 1 schematically illustrates that the frame FR is disposed below the mask MK to support the mask MK, but is not limited. The frame FR may be disposed above and below the edge of the mask MK to support the mask MK, and may extend the mask MK in the first direction DR1 and the second direction DR2.

The mask MK according to an embodiment may include a plurality of cell areas CA arranged along the first direction DR1 and the second direction DR2. In the present embodiment, the cell areas CA are illustrated to be spaced apart from each other along each of the first and second directions DR1 and DR2 but it is illustrated as an example. Thus, the mask MK may include more cell areas CA and the cell areas CA may be arranged along any one of the first direction DR1 and the second direction DR2, but it is not limited to any one embodiment.

The mask MK according to an embodiment may have a plate shape extending along the first direction DR1 and the second direction DR2. The mask MK may include a plurality of cell areas CA arranged along the first direction DR1 and the second direction DR2, and have a single plate shape such that the cell areas CA are connected to each other. Since the mask MK according to an embodiment includes a mask body MB (shown in FIG. 3) having a polymer film OF (shown in FIG. 3) formed of a polymer material such as polyimide (PI), the mask MK may be formed in a plate shape extending in both the first direction DR1 and the second direction DR2, not in a stick shape extending only in one direction among the first direction DR1 and the second direction DR2. However, the embodiment of the present disclosure is not limited thereto, and a mask MK according to another embodiment of the present disclosure may have a stick shape extending in one direction among the first direction DR1 and the second direction DR2 and being spaced apart in the other direction.

A plurality of through hole portions OPP may be defined in each of the cell areas CA. The through hole portions OPP may be arranged to be spaced apart from each other along the first direction DR1 and the second direction DR2. Each of the through hole portions OPP may be defined by penetrating the mask MK along the thickness direction DR3 (hereinafter, referred to as a third direction) of the mask MK.

Figure 2:
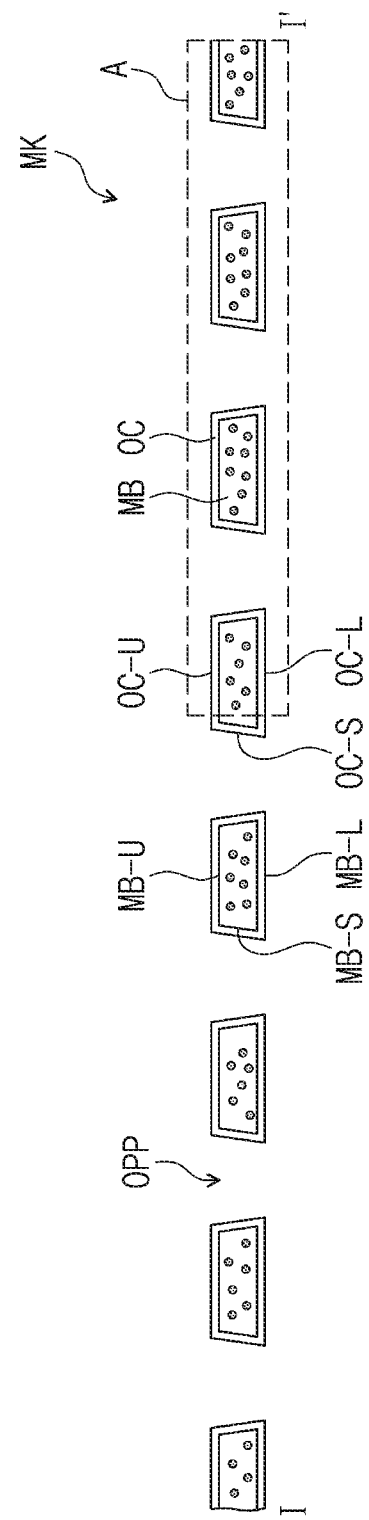
FIG. 2 is a cross-sectional view of a mask taken along line I-I' in FIG. 1 according to an embodiment of the present disclosure.
Figure 3:
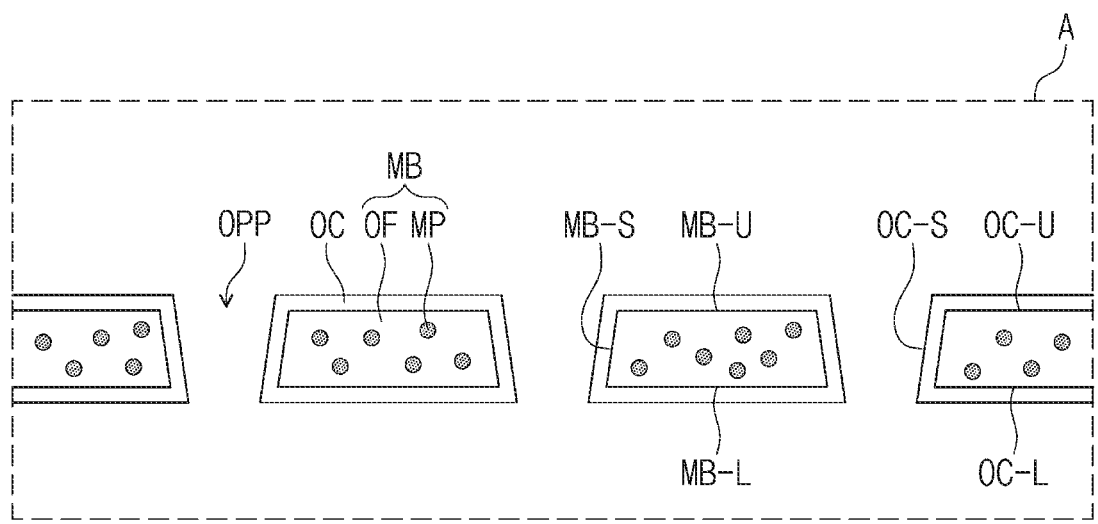
FIG. 3 is an enlarged cross-sectional view of a part of a mask according to an embodiment of the present disclosure.

FIG. 2 is a cross-sectional view of a mask taken along line I-I' in FIG. 1. FIG. 3 is an enlarged cross-sectional view of a part of a mask according to an embodiment of the present disclosure. FIG. 2 illustrates a cross section corresponding to line I-I' shown in FIG. 1. FIG. 3 illustrates an enlarged cross section of portion A of FIG. 2.

As illustrated in FIGS. 1, 2, and 3, the mask MK includes a mask body MB and a polymer coating layer OC. The polymer coating layer OC is disposed on an outer surface of the mask body MB.

At least one through hole portion OPP is defined in the mask body MB. A plurality of through hole portions OPP are defined in the mask body MB. The plurality of through hole portions OPP may be disposed to be spaced apart from each other at regular intervals in the first direction DR1 and/or the second direction DR2, and may form a predetermined pattern. Each of the plurality of through hole portions OPP may be defined by penetrating the mask MK along the third direction DR3.

The mask body MB includes a polymer film OF. The polymer film OF may be formed through a polymer resin. In an embodiment, the polymer film OF may include polyimide PI. The polymer film OF may be formed of polyimide PI.

The polymer film OF may have a thickness of about 3 μm to about 50 μm. When the thickness of the polymer film OF is less than 3 μm, the durability of the mask MK used in a deposition process may be insufficient. When the thickness of the polymer film OF is greater than 50 μm, the total thickness of the mask MK increases and deposition accuracy may thus be lowered when the mask MK is used in the deposition process.

The mask body MB includes a magnetic particle MP dispersed in the polymer film OF. The mask body MB may include a plurality of magnetic particles MP dispersed in the polymer film OF. The magnetic particles MP may be uniformly dispersed in the polymer film OF. With respect to the total mask body MB, the magnetic particles MP may be included in an amount of about 5% to about 95%.

The magnetic particle MP may be a material that is magnetized by a magnetic field, that is, a material having a magnetic force by being magnetized due to a magnetic plate MN (shown in FIG. 7) in a deposition apparatus. In an embodiment, the magnetic particle MP may be at least one metal selected from the group consisting of iron (Fe), manganese (Mn), nickel (Ni), and cobalt (Co) which belong to a ferromagnetic material. Alternatively, the magnetic particle MP may be an alloy containing at least one metal selected from the group consisting of iron, manganese, nickel, and cobalt. In an embodiment, the magnetic particles MP may be an alloy of nickel and iron. The magnetic particle MP may be a permalloy. The mask MK according to an embodiment may include two or more types of magnetic particles MP. A first magnetic particle and a second magnetic particle which are different from each other may be dispersed in the polymer film OF of the mask MK.

The magnetic particle MP may have a diameter of about 3 nm to less than about 10 μm. A plurality of magnetic particles MP may have an average diameter of about 3 nm to less than about 10 μm. Meanwhile, the average diameter of the magnetic particles MP corresponds to a value obtained by arithmetically averaging the diameters of a plurality of quantum dot particles. When the diameter of the magnetic particle MP is less than 3 nm, sufficient magnetic force is not induced to the mask MK by a magnetic material in the deposition process, so that the mask MK and a target substrate may not be in close contact. When the diameter of the magnetic particle MP is 10 μm or more, the magnetic particle MP is not properly dispersed in the mask MK, and the total thickness of the mask MK increases. Thus, the deposition accuracy may be lowered when the mask MK is used in the deposition process.

The mask MK includes a polymer coating layer OC disposed on an outer surface of the mask body MB. The polymer coating layer OC may cover the outer surface of the mask body MB. The polymer coating layer OC may contact the outer surface of the mask body MB and may cover the entire surfaces of the mask body MB in order to prevent the outer surfaces of the mask body MB from being exposed to the outside. More specifically, the polymer coating layer OC may include an inner wall coating layer OC-S disposed on an inner wall MB-S in which a through hole portion OPP is defined in the mask body MB. The polymer coating layer OC may further include an upper coating layer OC-U disposed on an upper surface MB-U of the mask body MB and a lower coating layer OC-L disposed on a lower surface MB-L of the mask body MB, in addition to the inner wall coating layer OC-S disposed on the inner wall MB-S of the through hole portion OPP. The polymer coating layer OC may be disposed on the entire surface of the mask body MB to cover the entire surface of the mask body MB. The polymer coating layer OC may contact the outer surface of the mask body MB. The polymer coating layer OC may contact all of the inner wall MB-S, the upper surface MB-U, and the lower surface MB-L of the mask body MB.

The polymer coating layer OC may be formed through a polymer resin. In an embodiment, the polymer coating layer OC may include polyimide (PI). The polymer coating layer OC may be made of polyimide (PI). The polymer film OF and the polymer coating layer OC may include the same material. The polymer film OF and the polymer coating layer OC may be formed through the same polyimide (PI).

The polymer coating layer OC may have a thickness of about 1 μm to about 10 μm. When the thickness of the polymer coating layer OC is less than 1 μm, the magnetic particles MP included in the mask body MB may be leaked to the outside to cause a process failure. When the thickness of the polymer coating layer OC is greater than about 10 μm, the total thickness of the mask MK increases. Thus, the deposition accuracy may be lowered when the mask MK is used in the deposition process.

The mask MK according to an embodiment includes a mask body MB in which a plurality of magnetic particles MP are dispersed in a polymer film OF containing polyimide (PI), etc., and also includes a polymer coating layer OC containing polyimide (PI), etc. on an outer surface of the mask body MB. Since the mask MK according to an embodiment uses, for a mask body, the polymer film OF formed of a polymer resin, it is possible to form a mask having a smaller thickness compared to when a mask is formed of an alloy such as an Invar (a nickel-iron alloy), and also possible to reduce the time and cost in the process of forming a through hole portion OPP or the like. In addition, the mask MK includes the magnetic particles MP dispersed in the polymer film OF, and thus the mask MK and the target substrate may be brought into close contact with each other due to a magnetic material in the deposition process. Therefore, shadows generated in the deposition process may be reduced and thus a more precise deposition process may be achieved. In addition, the polymer coating layer OC, which covers the mask body MB, may prevent the magnetic particle MP from being exposed to the outside of the mask MK in the deposition process, and fine particles may thus be prevented from being leaked to the outside in the deposition process to prevent defects and improve process reliability.

Hereinafter, a method of manufacturing a mask according to an embodiment of the inventive concept will be described. In the description of the method of manufacturing a mask according to an embodiment, like reference numerals are given to like elements as described above, and detailed description thereof will be omitted.

Figure 4:
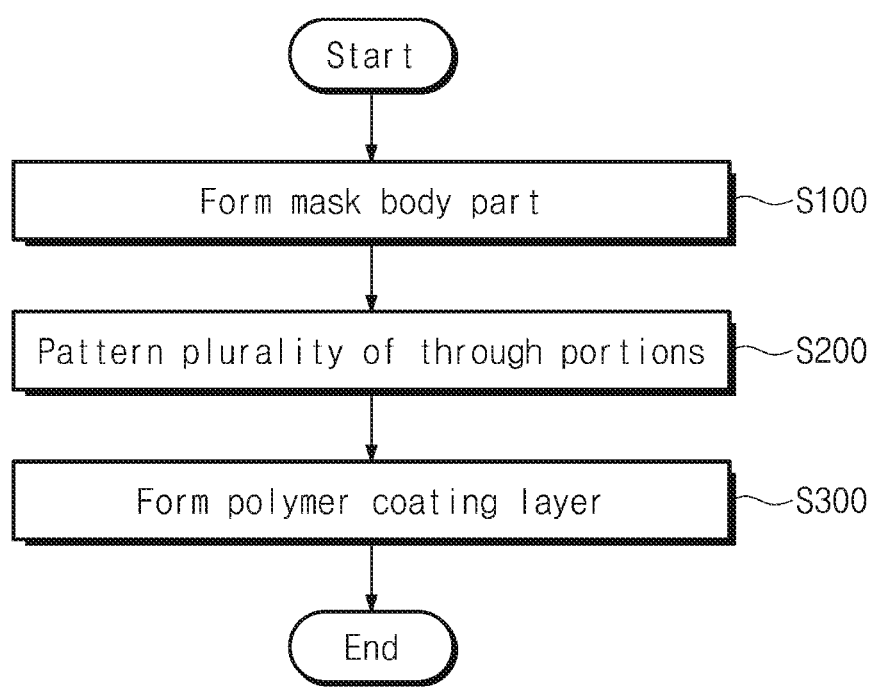
FIG. 4 is a flowchart illustrating a method of manufacturing a mask according to an embodiment of the present disclosure.

FIG. 4 is a flowchart illustrating a method of manufacturing a mask according to an embodiment of the inventive concept. FIGS. 5A, 5B, 5C, 5D, and 5E are cross-sectional views sequentially illustrating a method of manufacturing a mask according to an embodiment of the inventive concept. FIGS. 6A, 6B, and 6C are cross-sectional views sequentially illustrating some steps of a method of manufacturing a mask according to another embodiment of the present disclosure. In FIGS. 5A, 5B, 5C, 5D, 5E, 6A, 6B, and 6C, a method of manufacturing a mask according to an embodiment is sequentially illustrated at a part corresponding to the cross section of the mask shown in FIG. 3. FIGS. 6A, 6B, and 6C illustrate some steps of forming a mask body part of a method of manufacturing a mask according to an embodiment of the present disclosure.

Referring to FIG. 4, a method of manufacturing a mask according to an embodiment of the present disclosure may include steps of forming a mask body part (S100), patterning a plurality of through portions in the mask body part (S200), and forming a polymer coating layer by coating and covering inner surfaces of the plurality of through portions with a polymer resin (S300).

Figure 5A:
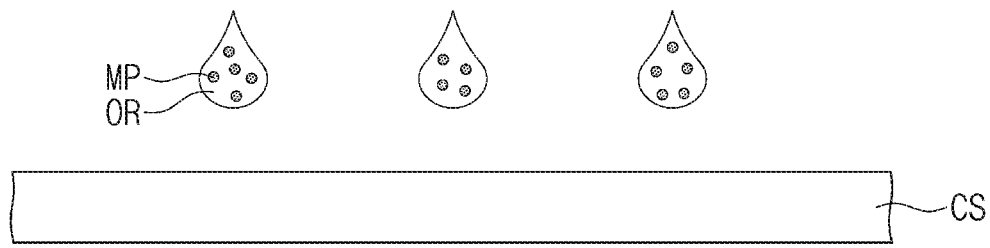
FIGS. 5A, 5B, 5C, 5D, and 5E are cross-sectional views sequentially illustrating a method of manufacturing a mask according to an embodiment of the present disclosure.
Figure 5B:
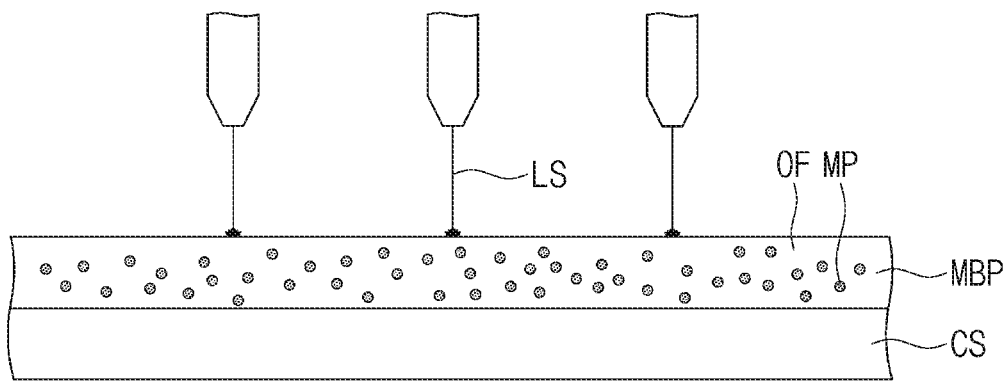
Figure 6A:
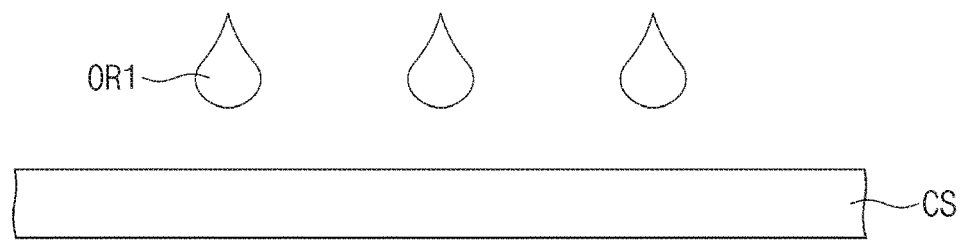
FIGS. 6A, 6B, and 6C are cross-sectional views sequentially illustrating some steps of a method of manufacturing a mask according to another embodiment of the present disclosure.
Figure 6B:
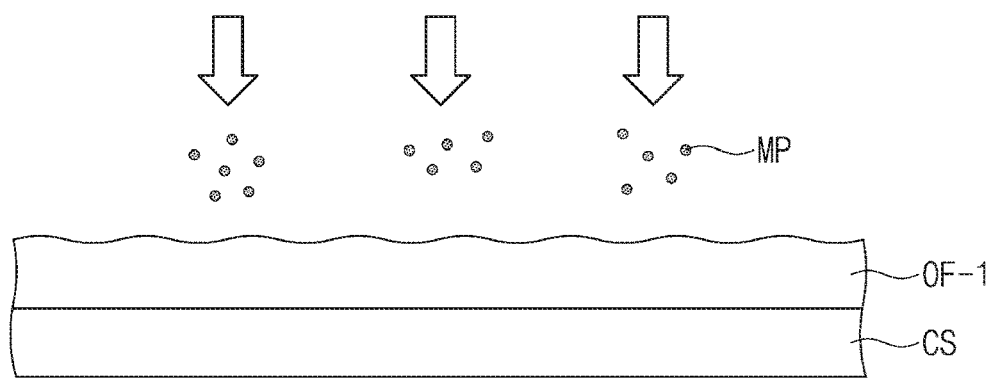
Figure 6C:
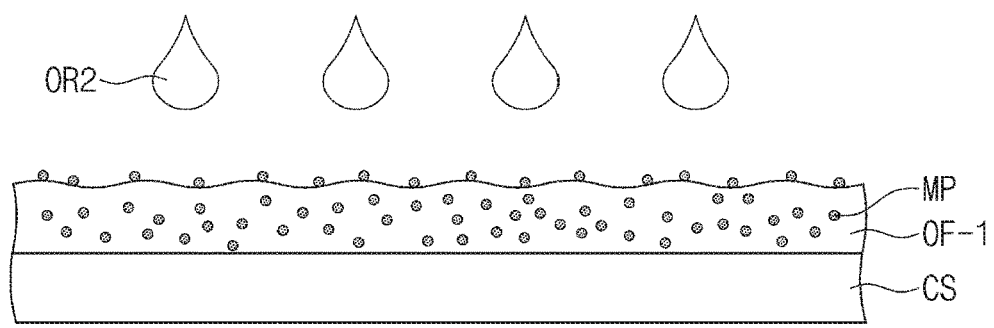

Referring to FIGS. 4, 5A, and 5B, a mask body part MBP is formed through a polymer resin OR in which a plurality of magnetic particles MP are dispersed on a carrier substrate CS. The mask body part MBP may be formed by being coated with the polymer resin OR in which the magnetic particles MP are dispersed. That is, a solution, in which the magnetic particles MP containing iron, manganese, nickel, and cobalt or an alloy thereof are dispersed in the polymer resin OR such as polyimide (PI), is prepared and then the mask body part MBP is formed by coating the carrier substrate CS with the solution.

Figure 5C:
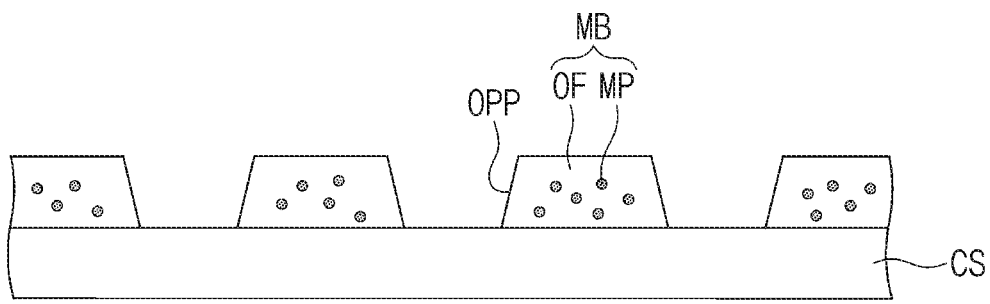

Referring to FIGS. 4, 5B, and 5C, a mask body MB is formed by patterning a through portion OPP on the mask body part MBP. The mask body MB may be formed by irradiating the mask body part MBP with a laser LS to pattern a plurality of through hole portions OPP. In the method of manufacturing a mask according to an embodiment, since a process of patterning the through hole portion OPP using the laser LS is included and the mask body part MBP patterned using the laser LS is formed through the polymer resin OR such as polyimide (PI), the laser LS processing time may be reduced, the amount of dust generated may be reduced, and any defects in which dust is adsorbed onto the processing surface of the through hole portion OPP may be reduced, compared to the case of a mask using an alloy such as an Invar. Accordingly, the time and cost of manufacturing a mask may be reduced, and thus a more reliable deposition mask may be provided. In addition, a polymer resin such as polyimide (PI) has chemical resistance to a cleaning liquid such as methylpyrrolidone (NMP) for cleaning deposits, thereby providing a deposition mask in which defects are prevented even in subsequent processes.

Figure 5D:
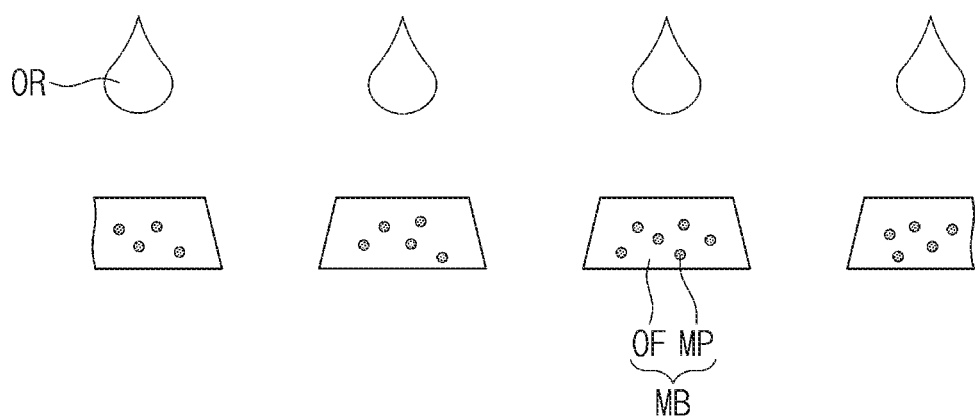
Figure 5E:
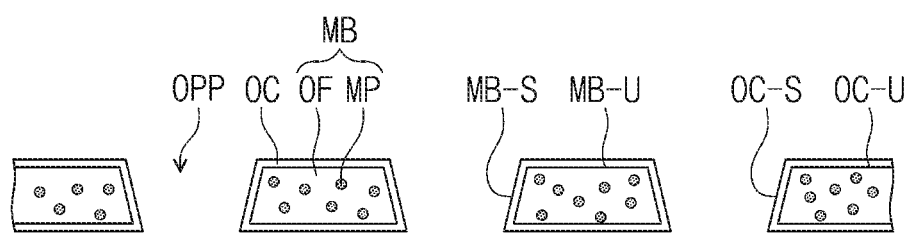

Referring to FIGS. 4, 5C, 5D, and 5E, the mask body MB is coated with the polymer resin OR to form the polymer coating layer OC. More specifically, the carrier substrate CS is removed from the mask body MB formed after the patterning process of the through hole portion OPP, and an inner wall MB-S of the mask body MB is coated and covered with the polymer resin OR to form a polymer coating layer OC. The polymer coating layer OC may be formed to coat not only the outer wall MB-S of the mask body MB, but also an upper surface MB-U of the mask body MB and a lower surface MB-L of the mask body MB. FIG. 5D illustrates coating with the polymer resin OR in the form of a solution but is not limited. The polymer coating layer OC may be formed by covering, with the polymer resin OR, the outer wall MB-S, the upper surface MB-U, and the lower surface MB-L of the mask body MB through the deposition process. The polymer resin OR forming the polymer coating layer OC and the polymer resin OR forming the mask body MB may be the same. In an embodiment, the polymer resin OR forming the polymer coating layer OC and the polymer resin OR forming the mask body MB may include the same polyimide (PI).

FIGS. 6A, 6B, and 6C illustrate some steps of forming a mask body part of a method of manufacturing a mask according to another embodiment of the present disclosure. Hereinafter, in the description of a method of manufacturing a mask according to another embodiment of the present disclosure, like reference numerals are given to like elements as descried above, and detailed description thereof will be omitted.

Referring to FIGS. 4, 6A, 6B, and 6C, the step of forming of the mask body part (S100) may be performed by not carrying out the dispersing of polymer resin OR1, OR2 solutions in which magnetic particles MP are dispersed, but by alternately carrying out the coating of polymer resins OR1 and OR2 and the dispersing of the magnetic particles MP. Specifically, the carrier substrate CS may be coated with the first polymer resin OR1, the magnetic particles MP may then be added to and dispersed on a preliminary mask body part OF-1, and the resultant substrate may then be coated with the second polymer resin OR2. The first polymer resin OR1 and the second polymer resin OR2 may be the same material. The first polymer resin OR1 and the second polymer resin OR2 may include the same polyimide (PI). FIGS. 6A, 6B, and 6C illustrate that dispersing of magnetic particle is performed once between two times of polymer resin coating, but the embodiment of the present disclosure is not limited. In the forming of the mask body part according to an embodiment of the present disclosure, the coating of the polymer resin and the dispersing of the magnetic particles may be alternately performed multiple times.

Hereinafter, a display panel manufacturing apparatus and a method of manufacturing a display panel using a mask according to an embodiment of the present disclosure will be described. In the description of a display panel manufacturing apparatus and a method of manufacturing a display panel according to an embodiment, like numerals are given to like elements as described above, and detailed description thereof will be omitted.

Figure 7:
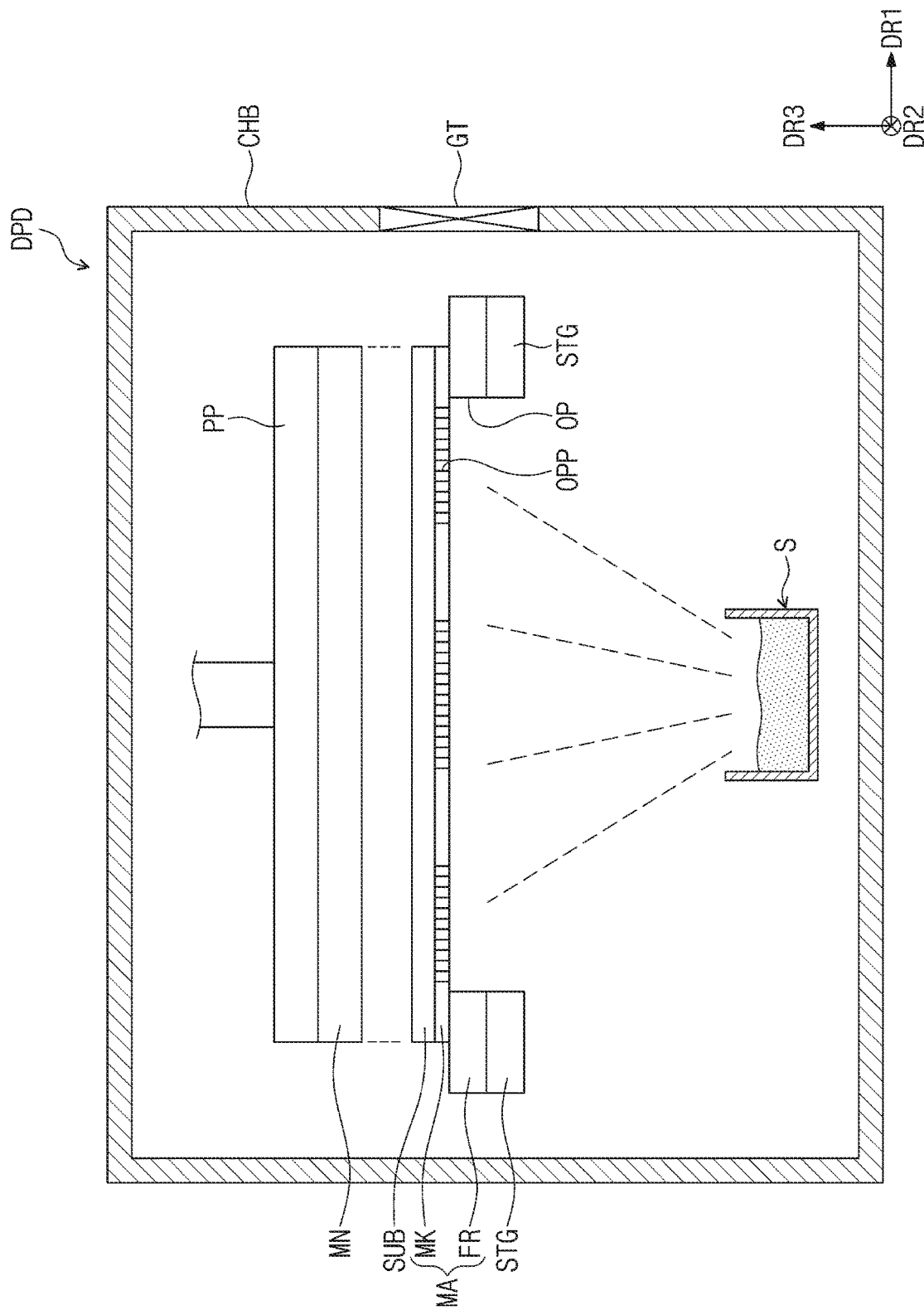
FIG. 7 is a cross-sectional view of a deposition apparatus according to an embodiment of the present disclosure.

FIG. 7 is a cross-sectional view of a deposition apparatus according to an embodiment of the present disclosure.

Referring to FIG. 7, a deposition apparatus DPD may include a chamber CHB, a deposition source S, a stage STG, a moving plate PP, and a mask assembly MA. The mask assembly MA comprises a mask MK and a frame FR.

The chamber CHB provides a closed space. The deposition source S, the stage STG, the moving plate PP, and the mask assembly MA may be disposed in the chamber CHB. The chamber CHB may have at least one gate GT. The chamber CHB may be opened and closed by the gate GT. A target substrate SUB may be loaded or unloaded through the gate GT provided in the chamber CHB.

The deposition source S includes a deposition material. In this case, the deposition material is a sublimable or vaporizable material, and may include one or more of inorganic, metal or organic materials. It is illustrated herein that the deposition source S according to an embodiment includes an organic material for manufacturing an organic light emitting element OLED (shown in FIG. 9).

The stage STG is disposed on the deposition source S. The mask assembly MA may be seated on the stage STG. The mask assembly MA may face the deposition source S. The stage STG may overlap the frame FR of the mask assembly MA to support the mask assembly MA. The stage STG does not overlap an opening OP of the frame FR. That is, the stage STG may be disposed outside of the movement path of the deposition material supplied from the deposition source S to the target substrate SUB.

The target substrate SUB is disposed on the mask assembly MA. The deposition material may penetrate a plurality of through portions OPP to be deposited onto the target substrate SUB.

The moving plate PP may align the target substrate SUB on the mask assembly MA. The moving plate PP may be movable up and down along the direction DR3 or left and right along the direction DR1. A magnetic plate MN may be disposed in the moving plate PP according to an embodiment to move the target substrate SUB through magnetic force. The moving plate PP according to an embodiment may have a magnetic plate MN and thus generate a magnetic force to allow the mask MK to come into contact with the lower part of the target substrate SUB. The moving plate PP according to an embodiment of the inventive concept may have a magnetic plate MN and thus fix the target substrate SUB on the mask assembly MA, thereby further improving the precision of the deposition process.

Figure 8C:
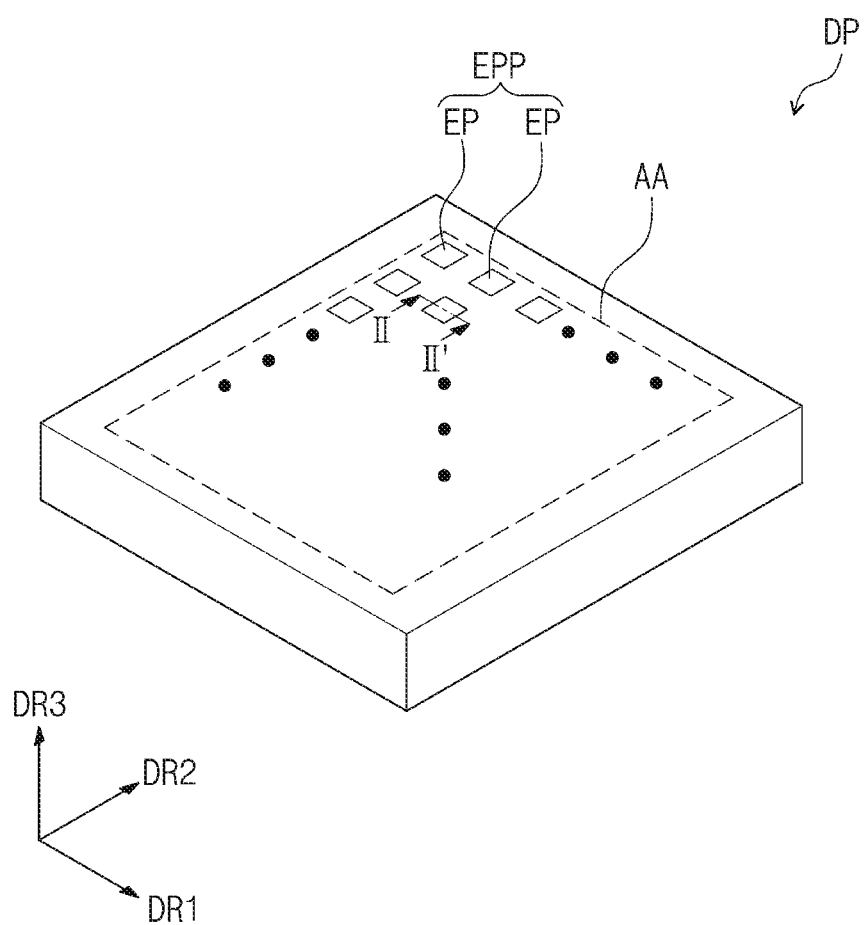

FIGS. 8A, 8B, and 8C are perspective views briefly illustrating some steps of a method of manufacturing a display panel according to an embodiment of the present disclosure.

Referring to FIGS. 1, 7, and 8A, a deposition material is deposited on the target substrate SUB through a deposition apparatus DPD, and then the mask assembly MA may be removed. An initial substrate DP-I1 from which the mask assembly MA has been removed may have light emitting pattern layers EPP formed on the target substrate SUB. The light emitting pattern layers EPP may be formed to correspond to cell areas CA of the mask MK. Each of the light emitting pattern layers EPP may include a plurality of light emitting patterns that are not shown. In this specification, the light emitting patterns EP may be referred to as deposition patterns.

Referring to 8A and 8B, the initial substrate DP-I1, from which the mask assembly MA has been removed, is cut along cutting lines CL defined in the initial substrate DP-I1, from which the mask assembly MA has been removed, and divided into a plurality of panels DP-P. Each of the panels DP-P may form a display panel DP.

According to an embodiment of the present disclosure, a plurality of the display panels DP may be formed by patterning a target substrate SUB. In addition, since a mask for forming the display panels DP according to an embodiment includes a mask body formed of a polymer material such as polyimide (PI), a large-area mask process suitable for forming a plurality of the display panels DP may be performed, so that the process time and cost may be reduced. However, the embodiment of the present disclosure is not limited, and in another embodiment of the present disclosure, a single display panel DP may be provided from the initial substrate DP-I1 according to the size of the display panel DP.

Referring to FIG. 8C, the display panel DP may include at least one active area AA. The active area AA may include a plurality of pixels (not shown). The active area AA may correspond to an area where the light emitting pattern layer EPP is disposed, and each of the light emitting patterns EP may correspond to the pixels. The light emitting patterns EP may be formed to correspond to the through hole portions OPP of the mask MK respectively.

Figure 9:
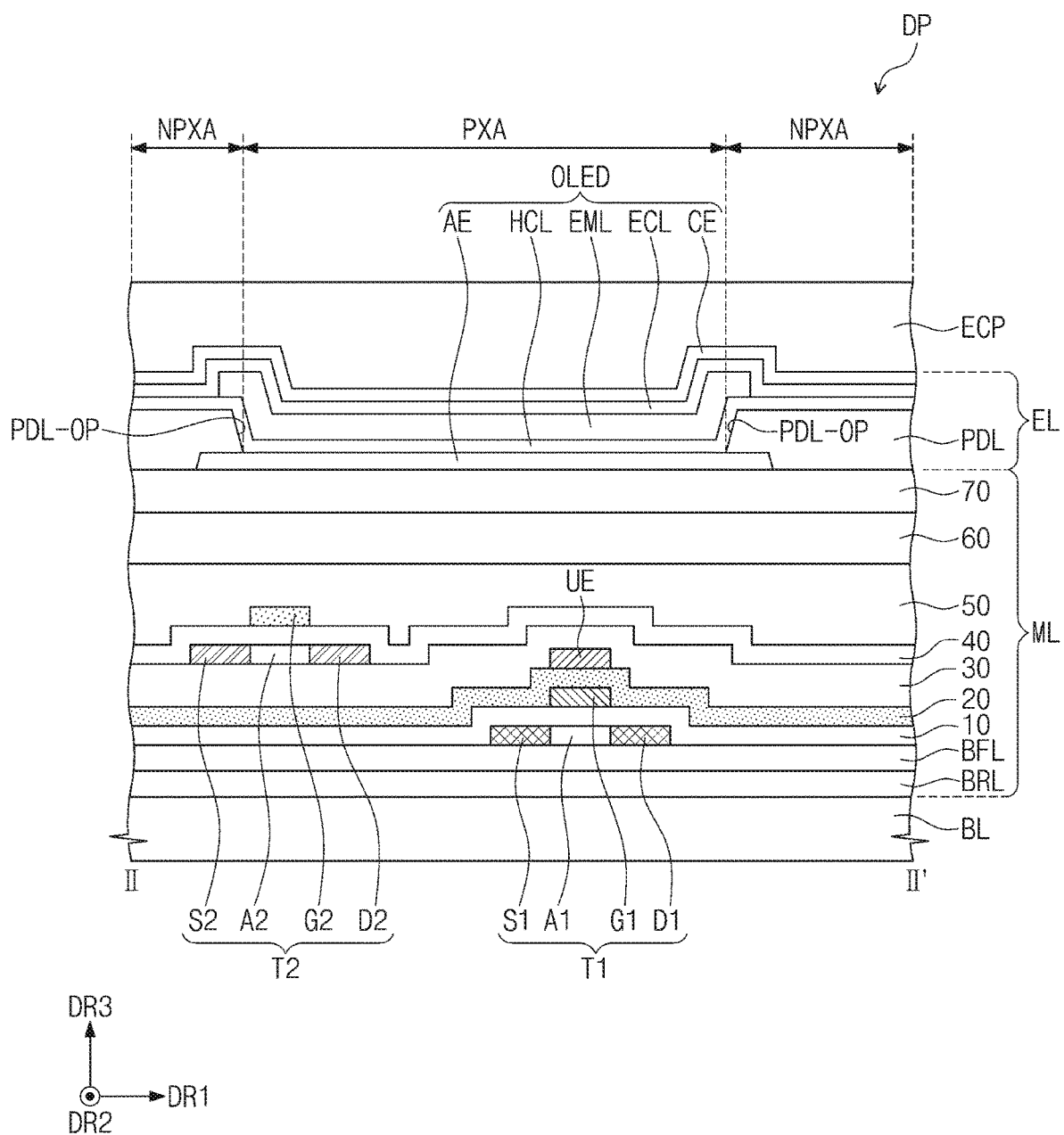
FIG. 9 is a cross-sectional view of a display panel taken along line II-II' according to an embodiment of the present disclosure.

FIG. 9 is a cross-sectional view of a display panel taken along line II-II' according to an embodiment of the present disclosure. FIG. 9 illustrates a part of a display panel having a cross section corresponding to the line II-II' shown in FIG. 8C.

Referring to FIG. 9, in an embodiment of the present disclosure, the display panel DP may be a light emitting display panel. FIG. 9 illustrates a cross section corresponding to one of a plurality of pixels is illustrated, and also illustrates cross sections corresponding to two transistors T1 and T2 and a light emitting element OLED.

As illustrated in FIG. 9, the display panel DP includes a base layer BL, a circuit element layer ML disposed on the base layer BL, a display element layer EL disposed on the circuit element layer ML, and an insulating layer ECP (hereinafter, defined as an upper insulating layer) disposed on the display element layer EL.

The base layer BL may include a synthetic resin layer. The base layer BL may be formed by forming a synthetic resin layer on a support substrate used in manufacture of the display panel DP, forming a conductive layer and an insulating layer on the synthetic resin layer, and then removing the support substrate.

The circuit element layer ML includes at least one insulating layer and a circuit element. The circuit element includes signal lines, pixel driving circuits, and etc. The circuit element layer ML may be formed through a process of forming an insulating layer, a semiconductor layer, and a conductive layer by coating and deposition and a process of patterning the insulating layer, the semiconductor layer, and the conductive layer by a photolithography process.

In the present embodiment, the circuit element layer ML includes a buffer layer BFL, a barrier layer BRL, and first, second, third, fourth, fifth sixth, and seventh insulating layers 10, 20, 30, 40, 50, 60, and 70. The buffer layer BFL, the barrier layer BRL, and the first, second, third, fourth, fifth sixth, and seventh insulating layers 10, 20, 30, 40, 50, 60, and 70 may include one of among an inorganic film and an organic film. The buffer layer BFL and the barrier layer BRL may include an inorganic film. At least one of the fifth, sixth, and seventh insulating layers 50, 60, and 70 may include an organic film.

FIG. 9 illustrates the arrangement of a first active A1, a second active A2, a first gate G1, a second gate G2, a first source S1, a second source S2, a first drain D1, and a second drain D2 which constitute the first and second transistors T1 and T2. In the present embodiment, the first active A1 and the second active A2 may include different materials. The first active A1 may include a polysilicon semiconductor, and the second active A2 may include a metal oxide semiconductor. The first source S1 and the first drain D1 are regions having a higher doping concentration than the first active A1, and function as electrodes. The second source S2 and the second drain D2 are regions for reducing the metal oxide semiconductor, and function as electrodes.

In an embodiment of the present disclosure, the first active A1 and the second active A2 may include the same semiconductor material, and in the case, the stacking structure of the circuit element layer ML may be further simplified.

The display element layer EL includes a pixel defining layer PDL and a light emitting element OLED. The light emitting element OLED may be an organic light emitting diode or a quantum dot light emitting diode. An anode AE is disposed on the seventh insulating layer 70. An opening PDL-OP of the pixel defining layer PDL exposes at least a portion of the anode AE. The opening PDL-OP of the pixel defining layer PDL may define a light emitting area PXA. A non-light emitting area NPXA, which does not overlap the opening PDL-OP, may surround the light emitting area PXA.

A hole control layer HCL and an electron control layer ECL may be commonly disposed in the light emitting area PXA and the non-light emitting area NPXA. An emission layer EML may be provided in the form of a pattern to correspond to the opening PDL-OP. The emission layer EML may be deposited through a method differing from those for the hole control layer HCL and the electron control layer ECL in the form of a film. The hole control layer HCL and the electron control layer ECL may be commonly formed in a plurality of pixels using an open mask. The emission layer EML may be formed in the form of a pattern to correspond to the opening PDL-OP using a mask according to an embodiment of the present disclosure. However, the embodiment of the present disclosure is not limited, and in the similar way as the emission layer EML, the hole control layer HCL and the electron control layer ECL may also be formed in the form of a pattern to correspond to the opening PDL-OP using a mask according to an embodiment of the present disclosure.

A cathode CE is disposed on the electron control layer ECL. An upper insulating layer ECP is disposed on the cathode CE. The upper insulating layer ECP may be a thin film encapsulation layer for encapsulating the display element layer EL. The upper insulating layer ECP may include a plurality of thin films. The plurality of thin films may include an inorganic film and an organic film. The upper insulating layer ECP may include an insulating layer for encapsulating the display element layer EL and a plurality of insulating layers for improving light extraction efficiency.

Figure 10A:
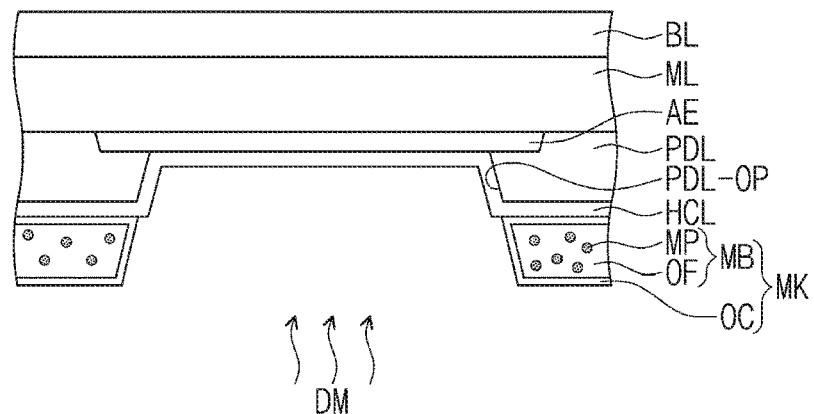
FIGS. 10A and 10B are cross-sectional views sequentially illustrating some steps of a method of manufacturing a display panel according to an embodiment of the present disclosure.
Figure 10B:
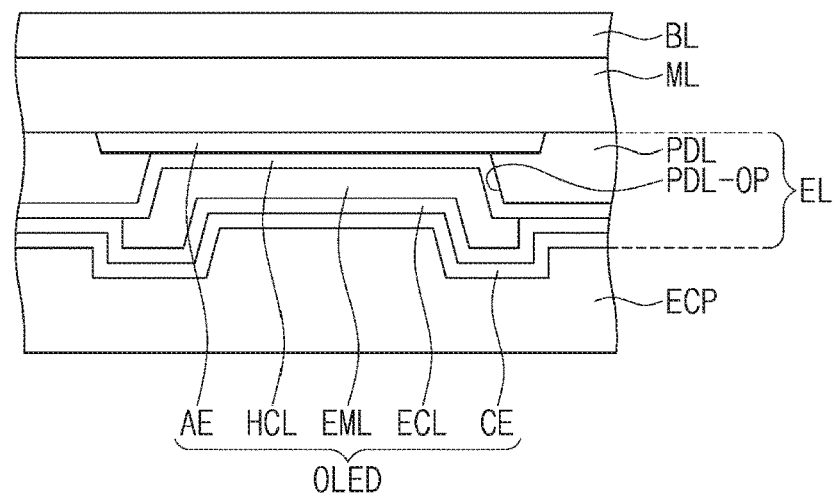

FIGS. 10A and 10B are cross-sectional views sequentially illustrating some steps of a method of manufacturing a display panel according to an embodiment of the present disclosure. FIGS. 10A and 10B sequentially illustrate forming a display element layer of a method of manufacturing a display panel according to an embodiment.

Referring to FIGS. 7, 9, 10A, and 10B, in a method of manufacturing a display panel according to an embodiment, the emission layer EML may be formed in a pattern to correspond to the opening PDL-OP through the mask MK. More specifically, in the deposition apparatus DPD, the emission layer EML may be formed through patterning such that a deposition material DM is deposited upward from the deposition source S through the mask MK to correspond to the opening PDL-OP. In the patterning of the emission layer EML, the mask MK may be disposed to contact the target substrate SUB through a magnetic plate MN included in the deposition apparatus DPD. That is, while the magnetic force is generated due to the magnetic plate MN through the magnetic particles MP included in the mask MK to bring the mask MK into contact with some elements of the target substrate SUB (in an embodiment, the pixel defining layer PDL), the patterning of the emission layer EML may be performed.

Using a typical polymer mask may cause the mask sagging to occur due to having a lower strength than a metal mask, and thus a gap to be formed between the mask and a target substrate, thereby resulting in a large shadow during formation of deposition patterns. However, in the method of manufacturing a display panel using the mask according to an embodiment of the present disclosure, the mask MK includes magnetic particles MP dispersed in a polymer film OF, and thus a deposition process is performed while the mask MK is in contact with the target substrate SUB. Accordingly, shadows may be prevented from occurring during the deposition process of light emitting patterns and a more precise deposition process may be achieved.

According to an embodiment of the present disclosure, the time and cost of manufacturing a mask for forming a light emitting pattern, etc. may be reduced, and shadows may also be prevented from being formed during the pattern deposition of the light emitting pattern as well, thereby preventing defects from occurring in a display panel which is formed using the mask.

Although the present disclosure has been described with reference to a preferred embodiment of the present disclosure, it will be understood by those skilled in the art that various changes in form and details may be made therein without departing from the spirit and scope of the present disclosure.

Accordingly, the technical scope of the present disclosure is not intended to be limited to the contents set forth in the detailed description of the specification, but is intended to be defined by the appended claims.

What is claimed is:

1. A mask, comprising:
    a mask body having a plurality of through hole portions, and including a polymer film and a plurality of magnetic particles dispersed in the polymer film; and
    a polymer coating layer disposed on an outer surface of the mask body.

2. The mask of claim 1, wherein each of the polymer film and the polymer coating layer comprises polyimide (PI) respectively.

3. The mask of claim 1, wherein each of the magnetic particles comprises at least one metal selected from the group consisting of iron (Fe), manganese (Mn), nickel (Ni), and cobalt (Co), or an alloy containing at least one selected from the group.

4. The mask of claim 1, wherein the polymer coating layer contacts the polymer film.

5. The mask of claim 1, wherein the polymer film and the polymer coating layer are made out of the same material.

6. The mask of claim 1, wherein the polymer film has a thickness of about 3 μm to about 50 μm.

7. The mask of claim 1, wherein the magnetic particle has a diameter of about 3 nm to about less than 10 μm.

8. The mask of claim 1, wherein the polymer coating layer has a thickness of about 1 μm to about 10 μm.

9. The mask of claim 1, wherein the polymer coating layer covers an entireties of an upper surface and a lower surface of the polymer film, and covers inner walls of the plurality of through hole portions.

10. A method of manufacturing a mask, comprising steps of:
- forming a mask body part through a polymer resin in which a plurality of magnetic particles are dispersed;
- patterning a plurality of through hole portions in the mask body part; and
- forming a polymer coating layer by coating and covering inner walls of the plurality of through hole portions with a polymer resin.

11. The method of claim 10, wherein in the forming of the mask body part,
- the polymer resin comprises polyimide (PI), and
- the magnetic particles comprise at least one metal selected from the group consisting of iron (Fe), manganese (Mn), nickel (Ni), and cobalt (Co), or an alloy containing at least one selected from the group.

12. The method of claim 10, wherein the forming of the mask body part comprises coating a carrier substrate with the polymer resin in which the magnetic particles are dispersed.

13. The method of claim 10, wherein the forming of the mask body part is accomplished by steps of:
- performing a primary coating with the polymer resin,
- dispersing the magnetic particles in the polymer resin subjected to the primary coating, and
- performing a secondary coating with the polymer resin on the polymer resin subjected to the primary coating.

14. The method of claim 10, wherein the plurality of through hole portions are patterned using a laser.

15. The method of claim 10, wherein the polymer coating layer covers an entireties of an upper surface and a lower surface of the mask body part.

16. The method of claim 10, wherein the mask body part and the polymer coating layer are formed through the same polymer resin.

17. A method of manufacturing a display panel, comprising:
- preparing a target substrate;
- disposing, below the target substrate, a mask in which a plurality of through hole portions are defined;
- forming, below the target substrate, a plurality of light emitting patterns corresponding to the plurality of through hole portions; and
- removing the mask,
- wherein the mask comprises:
  - a mask body having the plurality of through hole portions and including a polymer film and a plurality of magnetic particles dispersed in the polymer film; and
  - a polymer coating layer disposed on an outer surface of the mask body.

18. The method of claim 17, wherein during the disposing of the mask below the target substrate, a magnetic plate spaced apart from the mask with respect to the target substrate which is disposed in-between is disposed.

19. The method of claim 17, wherein during the disposing of the mask below the target substrate, the target substrate and the mask contacts each other.

20. The method of claim 17, wherein the display panel comprises a plurality of pixels, and
- each of the plurality of light emitting patterns are arranged in the pixels respectively.

* * * * *